United States Patent [19]

Zuk

[11] 4,021,686
[45] May 3, 1977

[54] FLIP-FLOP WITH SETTING AND SENSING CIRCUITRY

[75] Inventor: Borys Zuk, Somerville, N.J.

[73] Assignee: RCA Corporation, New York, N.Y.

[22] Filed: May 12, 1975

[21] Appl. No.: 576,609

[52] U.S. Cl. .............................. 307/291; 307/238; 307/247 R; 328/206; 340/173 FF
[51] Int. Cl.² ........................................ H03K 3/29
[58] Field of Search ............... 307/247, 291, 235 T, 307/268, 269, 238; 328/206, 196, 203; 340/173 FF

[56] References Cited

UNITED STATES PATENTS 3,764,825 10/1973 Stewart .............................. 307/291
3,863,229 1/1975 Gershbach ......................... 307/291

Primary Examiner—John Zazworsky
Assistant Examiner—Marcus S. Rasco
Attorney, Agent, or Firm—H. Christoffersen; Henry I. Schanzer

[57] ABSTRACT

A flip-flop comprising two, cross-coupled, transistors each having one end of its main conduction path connected to a common current source, and in which switching between states is accomplished by the application of voltages coupled through voltage dropping resistors connected to the other ends of the main conduction paths of the two transistors. The circuitry for applying the switching voltages includes an emitter-coupled logic (ECL) gate comprising a differential amplifier stage containing a pulse forming network for producing a sampling pulse at one output and a clocking signal at another output. The sampling pulse is "AND'ed" with input data signals to set the flip-flop to one binary condition and the clocking signal is used to reset the flip-flop to the other binary condition. Circuitry for sensing the state of the flip-flop includes a differential stage whose inputs are coupled to the control electrodes of the transistors of the flip-flop.

17 Claims, 4 Drawing Figures

FLIP-FLOP WITH SETTING AND SENSING CIRCUITRY

This invention relates to bistable flip-flops and to means for setting and sensing the states of the flip-flop. More particularly, the invention is directed to flip-flops which my be switched from one state to another by altering the potentials on their power supply lines.

Flip-flop memory cells which may be switched to different states by altering the potential on their supply lines are described in U.S. Pat. No. 3,530,443 issued Sept. 22,1970 to H. S. Crafts et al., and in U.S. Pat. No. 3,533,087 issued Oct. 6, 1970 to Borys Zuk, the applicant of the instant application. The patented circuits provide many advantages. But, to switch the patented memory cells from one state to another requires relatively large signals. Typically, the amplitude of the voltage swings necessary to switch the state of the cells must exceed the operating potential applied to the cell minus the threshold voltage of the on transistors. Also, the switching of a memory cell from one state to another is dependent on the threshold voltages of the cross-coupled transistors. The threshold voltage may be defined as the value of gate-to-source potential, or base-to-emitter potential, which must be exceeded to cause conduction in a transistor. In reference to IGFETs, the threshold voltage is referred to as $V_T$. In reference to bipolar devices, the threshold voltage is referred to as $V_{BE}$. A circuit dependent on the threshold voltage of the devices comprising the circuit often is unreliable. Threshold voltages may vary from device to device and as a function of ambient conditions (e.g. temperature). To compensate for variations in threshold voltage, the already large voltage swings necessary to switch the memory cells from one state to another must be made even larger. This result in greater power dissipation and requires the manufacture of devices which can withstand the greater voltage swing and increased dissipation. Another disadvantage with circuits requiring large voltage swings to switch from one state to another is that it increases the time necessary to operate the devices. For example, it normally takes much longer for a signal to swing 10 volts than 1 volt. In addition, the application of large voltage swings causes large voltage spikes to be couple through the various accessing lines to other components of the circuit. Also, in the patented circuits, the two IGFETs forming an inverter may be on at the same time during a switching interval resulting in a relatively low impedance path between a signal input point and a point of reference potential.

Applicant's invention resides in part in the recognition that by differentially connecting two cross-coupled transistors, a flip-flop can be formed which can be switched from one state to another by relatively small potential changes in the power supply lines and, wherein the switching levels of the flip-flop are, to a large extent, independent of the threshold voltages of the cross-coupled transistors.

Circuits embodying the invention include two, cross-coupled, differentially connected transistors. Each transistor has first and second electrodes defining the ends of a main conduction path and a control electrode. The differential connection includes a relatively constant current source connected to the first electrodes of the two transistors. The cross coupling is achieved by coupling the control electrode of each transistor to the second electrode of the other transistor. A first impedance is connected between the second electrode of one transistor and a first line, and a second impedance is connected between the second electrode of the other transistor and a second line. Differential signals may be applied to the first and second lines.

Circuits for sensing which one of the two transistors is conducting may include a differential stage whose two inputs are coupled to the second electrodes of the two transistors.

In the accompanying drawing, like reference characters denote like components; and FIG. 1 is a schematic drawing of a circuit embodying the invention;

Figure 1:
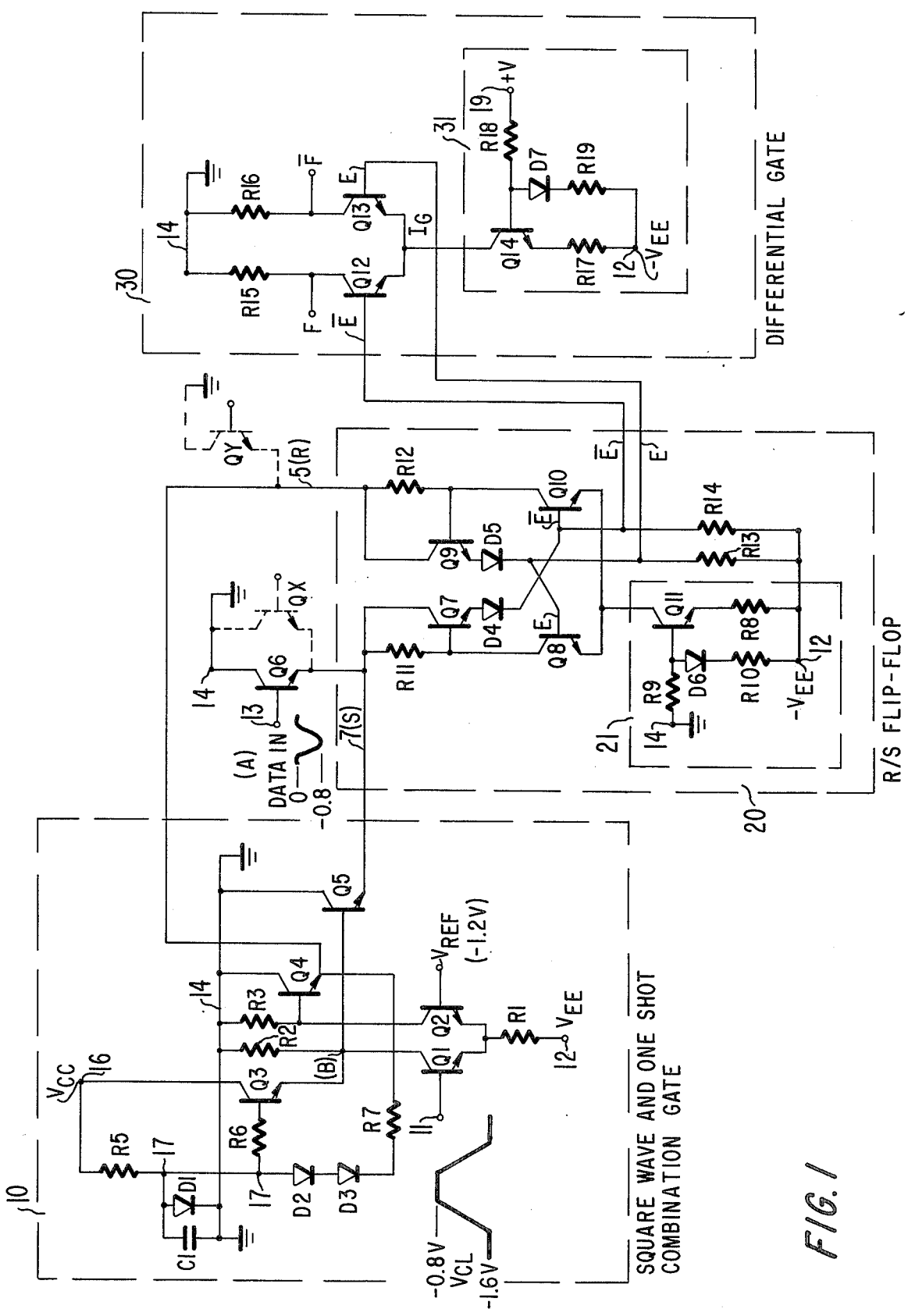

In the circut of FIG. 1, a clocking or excitation signal ($V_{CL}$) is applied to terminal 11 of a combinational gate 10, and a data input signal (A) is applied to a terminal 13 outside the gate. In response to the clocking signal combinational gate 10 produces a square wave (R) on output line 5 which is used to reset a flip-flop 20, and a sampling pulse (B) which is combined with the date input (A) by means of transistor Q5 and Q6 for producing a sampled signal (S) on line 7 which is used to set flip-flop 20. A differential gate circuit 30 senses the state of the flip-flop and produces an output pulse (F, F̄) each time the flip-flop is set and then reset.

In the circuit of FIG. 1 NPN bipolar transistors are used to illustrate the invention. However, it is to be understood that the invention may be practiced using any other suitable kind of transistors. (e.g. PNP bipolars or insulated-gate field-effect transistors).

Figure 2:
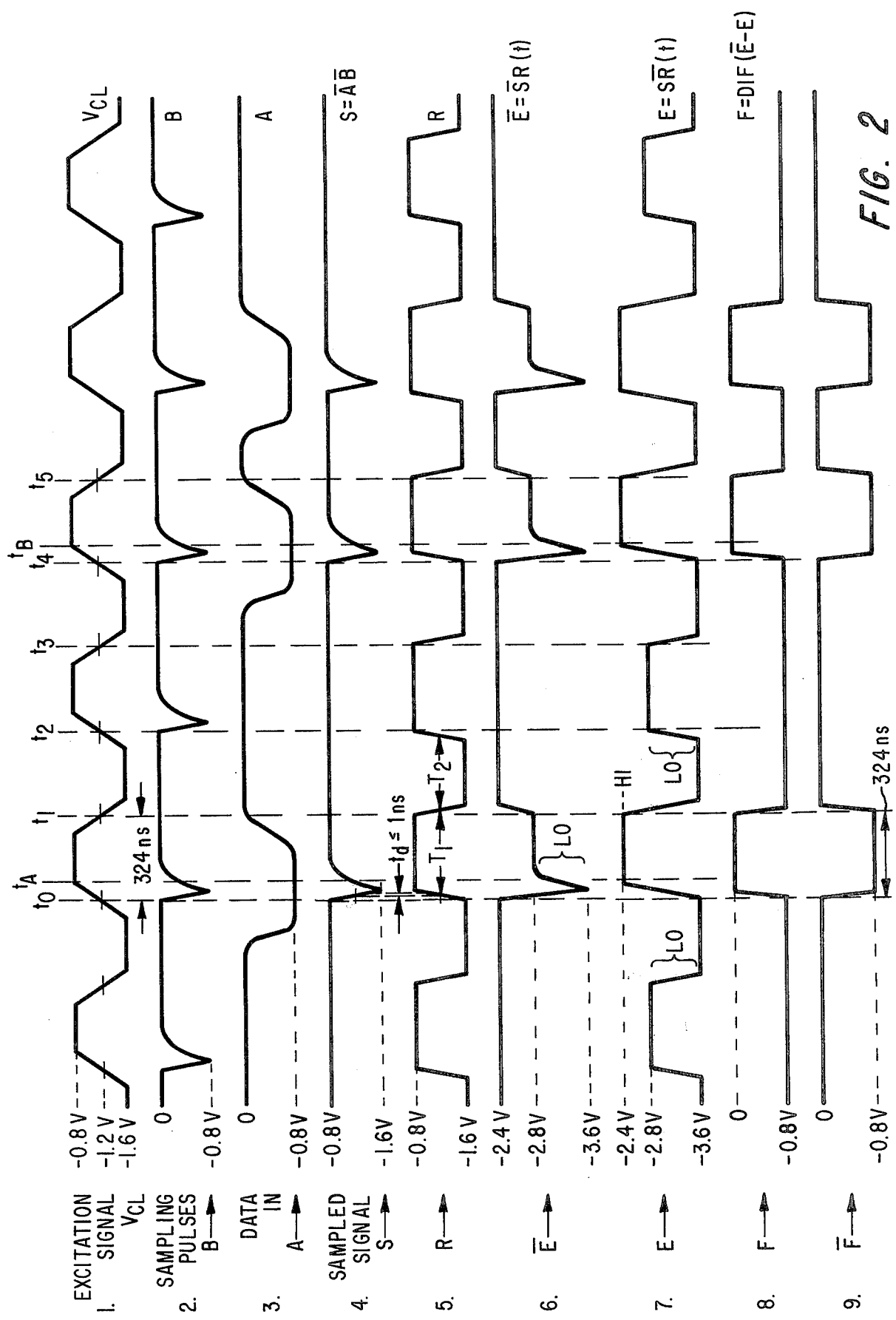
FIG. 2 is a diagram of waveforms present at various points of the circuit of FIG. 1.

The combinational gate 10 includes transistors Q1 and Q2 having their emitters connected in common to one end of resistor R1. The other end of resistor R1 is connected to terminal 12 to which is applied a potential of $-V_{EE}$ volts. Resistors R2 and R3 are connected between the collectors of transistors Q1 and Q2, respectively, and a conductor 14 to which is applied ground potential. The base of transistor Q2 is connected to a point of reference potential ($V_{REF}$) and the base of transistor Q1 is connected to clocking terminal 11. The $V_{CL}$ clocking signals applied to terminal 11 vary in amplitude above and below $V_{REF}$ as shown in FIG. 2. Emitter follower transistors Q4 and Q5 are connected at their bases to the collectors of transistors Q2 and Q1, respectively, and at their collectors to terminal 14. The emitters of transistors Q4 and Q5 are connected to output lines 5 and 7, respectively.

A pulse shaping network is coupled between the emitter of transistor Q4 and the collector of transistor Q1. The network includes: (1) transistor Q3 connected at its collector to terminal 16 to which is applied $+V_{CC}$ volts, at its emitter to the collector of transistor Q1, and at its base through current limiting resistor R6 to terminal 17; (2) a delay circuit comprising timing resistor R5 connected between terminals 16 and 17, and a timing capacitor C1 connected between terminal 17 and conductor 14. In addition, a diode D1 is connected in parallel with capacitor C1 and is poled to conduct current from terminal 17 to conductor 14. Diode D1, whose forward drop ($V_F$) is assumed to be equal to the base-to-emitter drop ($V_{BE}$) of a transistor, prevents the potential at terminal 17 from exceeding $V_{BE}$ volts; and (3) a clamp circuit comprised of diodes D2 and D3 connected in series with resistor R7 between terminal 17 and the emitter of transistor Q4. Diodes D2 and D3 are poled to conduct current in the forward direction from terminal 17 to the emitter of transistor Q4 and function to clamp the potential at terminal 17 to approximately $2V_{BE}$ volts above the potential at the emitter of transistor Q4.

Transistor Q6 is connected at its base to data input terminal 13, at its collector to conductor 14, and at its emitter, in common with the emitter of transistor Q5, to line 7. Transistors Q5 and Q6 function as emitter followers and form a negative AND gate, which produces a sampled output (S) on line 7 in response to the sampling pulse (B) produced at the collector of transistor Q1 and the Data Input signal (A) applied to terminal 13.

For ease of explaining the operation of the combinational gate 10 of FIG. 1 assume the following conditions: (1) $-V_{EE}$ is $-5$ volts and $+V_{CC}$ is $+5$ volts; (2) the base-to-emitter voltage drop ($V_{BE}$) of each transistor and the forward drop ($V_F$) of each diode is 0.8 volts; (3) $V_{REF}$ is $-1.2$ volts; (4) the signals applied to terminal 11 vary between $-1.6$ volts and $-0.8$ volt; (5) the transistors have high betas consequently, the impedance looking into their bases is relatively high and little base current is drawn; and (6) the low voltage condition at a point, terminal, or node is defined as logic 0 or "low" and the high voltage condition at that point, terminal, or node is defined as logic 1 or "high".

Assume that the $V_{CL}$ signal applied to the base of transistor Q1 is initially at $-1.6$ volts. For this input condition, transistor Q1 is turned off and transistor Q2 with $-1.2$ volts at its base is turned on. Consequently, the collector potential ($V_{C1}$) of transistor Q1 is at, or close to, zero volts. By proper selection of the ohmic values of resistors R1 and R3, the collector potential ($V_{C2}$) of transistor Q2 goes to approximately $-0.8$ volt. Transistor Q4, functioning as an emitter follower, translates the potential at its base (which is equal to $V_{C2}$) less one $V_{BE}$ drop to its emitter. The emitter potential ($V_{E4}$) of transistor Q4 is then approximately $-1.6$ volts.

Assuming that the voltage drop across each one of clamping diodes D2 and D3 is 0.8 volt and also assuming negligible current through resistor R7, the potential ($V_{17}$) at terminal 17 will be approximately $2V_F$ drops above $V_{E4}$. With $V_{E4}$ at $-1.6$ volts, $V_{17}$ is at approximately zero volts. Transistor Q3 is nonconducting since its base is at approximately zero volts and its emitter is also at zero volts. Capacitor C1 is maintained in a discharged condition since there is substantially zero volts across it. Therefore, when transistor Q2 is on (Q1 off) the clamp circuit (diodes D2 and D3) prevents the charging of capacitor C1 and the turn on of transistor Q3.

Assume now that $V_{CL}$ makes a transition from $-1.6$ volts to $-0.8$ volt. This causes transistor Q1 to turn on and raises the potential at the emitters of transistors Q1 and Q2 from $-2.0$ volts to $-1.6$ volts causing transistor Q2 to turn off. The collector current of transistor Q1 flows through resistor R2 causing $V_{C1}$ to drop. Resistor R2 may be made larger than resistor R3 in order to get $V_{C1}$ to drop quickly and more negatively that $-0.8$ volt. Concurrently, $V_{C2}$ rises to approximately zero volts and, correspondingly, the potential $V_{E4}$ at the emitter of transistor Q4 rises from $-1.6$ volts to $-0.8$ volt.

When $V_{E4}$ rises to $-0.8$ volt, $V_{17}$ can rise to $+0.8$ volt. Indeed, $V_{17}$ rises exponentially from 0 volts towards $+V_{CC}$ volts with a time constant controlled primarily by resistor R5 and capacitor C1. However, when $V_{17}$ reaches $+0.8$ volt, diode D1 or diodes D2 and D3 clamp the potential at terminal 17 preventing $V_{17}$ from rising above $+0.8$ volt.

Until $V_{17}$ begins to rise, the base of transistor Q3 is at, or close to, zero volts. Due to the charge storage effect of capacitor C1, $V_{17}$ does not rise immediately. In addition, current limiting resistor R6, in the base of transistor Q3 limits the current into the base of transistor Q3 thereby slightly increasing its turn on time and thereby ensuring that $V_{C1}$ goes negative.

Transistor Q3, functioning as an emitter follower, translates the potential level at terminal 17 less one $V_{BE}$ drop to the collector of transistor Q1. As $V_{17}$ increases, transistor Q3 causes a corresponding increase in $V_{C1}$. When $V_{17}$ reaches $+0.8$ volt, transistor Q3 clamps the voltage at the collector of transistor Q1 to approximately zero volts. Transistor Q3 thus functions to restore the high voltage level condition at the collector of transistor Q1 a short time delay after its transition to a low voltage level condition. Typical sampling pulses produced at the collector of transistor Q1 in response to $V_{CL}$ signals are shown in waveform B of FIG. 2. Emitter follower transistor Q5 translates or level shifts the $V_{CL}$ potential minus one $V_{BE}$ drop to line 7 when a data IN signal A is present at terminal 13.

In response to data input signals (A) of the type shown in waveform A of FIG. 2 and the sampling pulses (B) produced at the collector of transistor Q1, there is produced a sampled signal (S) on line 7 of the type shown in waveform S of FIG. 2.

The sampled signal (S) which may be expressed logically as $S=\overline{A.B}$ is at $-1.6$ volts (lo) if, and only if, both the data input signal (A) applied to the base of transistor Q6 and the sampling pulse (B) applied to the base of transistor Q5 are simultaneously $-0.8$ volt. If either the signal A or the signal B is at zero volts (high) the signal S on line 7 is at $-0.8$ volts (high). Since the sampling pulses are very narrow, they determine the shape of the sampled signals on line 7.

The signal produced at the emitter of transistor Q4 is shown in waveform R of FIG. 2. This signal is in phase with $V_{CL}$ and is substantially identical to that at the collector of transistor Q2 except for a negative direct current (dc) level shift of 0.8 volt.

Gate 10 thus produces at one output (the collector of transistor Q1), a negative going pulse each time $V_{CL}$ goes positive and produces at another output (the collector of transistor Q2) a square wave similar to $V_{CL}$ but having sharper rise and fall times.

Since the signals produced at the collectors of transistor Q1 and Q2 and on lines 5 and 7 are produced by the same gate 10, the delay between the negative going edge of the sampling signals (B) and the positive going edge of a corresponding square wave signal (R) is very small. Measurements made on an experimental circuit embodying the invention indicated that at the midpoints of the B or S wavefronts, as shown in FIG. 2 following time $t_0$, there was a delay of less than one nanosecond (1 $\times 10^{-9}$ seconds) between their leading edges. Thus, two non-complementary signals having a high degree of leaking edge time coincidence are generated. As further detailed below, the signals on line 7 and 5 may be used to set and reset, respectively, a flip-flop 20. The setting and resetting of the flip-flop establishes the pulse width of an output pulse as sensed by differential gate 30. The pulse width of the output pulse is well controlled and may be accurate as the pulse width of the clocking signal ($V_{CL}$) or any other selected source of excitation signal.

A narrow sampling pulse (B) is advantageous when it is desirable and/or necessary to sample a signal for only a brief period of time. This is so when, as in this application (though the invention is in no way limited thereto), the data input pulses may have different rise and fall times, may be irregular and noisy and not exactly repetitive. Also, as may be seen from FIG. 2, the low level of the data input does not normally exist for the full length of a $V_{CL}$ pulse or an R pulse. However, a low level on waveform A, if present, is normally present when the waveform $V_{CL}$ makes a positive going transition. Therefore, it is preferable that the data input be sampled for only a brief instant during the positive going transition of the $V_{CL}$ signal. It should be appreciated that the pulse width of the sampling pulse (B) is determined by timing capacitor Cl and timing resistor R5.

It should be appreciated that the pulse forming network connected between the emitter of transistor Q4 and the collector of transistor Q1 provides a function normally produced by a one-shot (monostable multivibrator). Thus, gate 10 functions as a combinational gate.

In this application, a particular $V_{CL}$ signal was applied to the gate 10. It should be appreciated that any signal level or pulse could, instead, be applied as the control signal to terminal 11. A sampling pulse (due to one-shot action) would be produced at one output each time the control or excitation signal changed from a level of −1.6 volts to −0.8 volt and a signal in phase with the control signal but having faster rise and fall times would be produced at the other output.

It should also be mentioned that additional transistors such as QX, shown in phantom view, could have their conduction paths connected in parallel with transistors Q5 and Q6 with independent control signals applied to their bases. Similarly, additional transistors such as QY, shown in phantom view, could have their conduction paths connected in parallel with transistors Q4 with independent control signals applied to their bases.

The set-reset flip-flop 20 includes transistors Q8 and Q10 having their emitters connected in common to a source 21 of relatively constant current, $I_X$. The source 21 includes: (1) transistor Q11 connected at its collector to the emitters of transistors Q8 and Q10; (2) resistor R8 connected between the emitter of transistor Q11 and conductor 12; (3) base bias resistor R9 connected between conductor 14 and the base of transistor Q11; and (4) diode D6 and resistor R10 connected in series between the base of transistor Q11 and conductor 12. A resistor R11 is connected between the collector of transistor Q8 and line 7 and a resistor R12 is connected between the collector of transistor Q10 and line 5. Transistors Q8 and Q10 are cross-coupled by means of emitter follower transistors Q7 and Q9 and diodes D4 and D5. Transistor Q7 is connected at its base to the collector of transistor Q8, at its collector to line 7 and at its emitter to the anode of diode D4. Diode D4 is connected at its cathode to the base of transistor Q10. Transistor Q9 is connected at its base to the collector of transistor Q10, at its collector to line 5 and at its emitter to the anode of diode D5. Diode D5 is connected at its cathode to the base of transistor Q8. The two outputs E and $\overline{E}$ of the flip-flop are taken at the bases of transistors Q8 and Q10, respectively. Output load resistors R13 and R14 are connected between the bases of transistor Q8 and Q10, respectively, and conductor 12.

The flip-flop is set to one binary condition by the application of a negative going signal (S) on line 7. The flip-flop is set to the other binary condition by the negative going trailing edge of signal (R) on line 5.

The differential gate circuit 30, which senses, differentially, the outputs of flip-flop 20, includes transistor Q12 and Q13 connected at their bases to the bases of transistors Q10 and Q8, respectively. The collectors of transistors Q12 and Q13, at which are produced two outputs F and $\overline{F}$, respectively, are returned via resistors R15 and R16 respectively, to conductor 14. Transistors Q12 and Q13 are connected at their emitters to a source 31 of relatively constant current $I_G$. Source 31 includes: (a) transistor Q14 connected at its collector to the emitters of transistors Q12 and Q13 and at its emitter via resistor R17 to conductor 12; (b) base bias resistor R18 connected between terminal 19, to which is applied a positive source of potential and the base of transistor Q14; and (c) diode D7 an resistor R19 connected between the base of transistor Q14 and conductor 12.

The operation of current sources 21 and 31 is well-known in the art. Each of the current sources includes a transistor (Q11 and Q14, respectively) having a fixed forward bias applied between its base (e.g. ground or some other positive value of potential) and its emitter (e.g. −$V_{EE}$ volts). The fixed potentials applied between the bases and emitters of transistors Q11 and Q14 cause their collector currents to be relatively constant and to a first approximation, these currents are independent of the potentials at the collectors of the transistors Q11, Q14. The collector current of transistor Q11 is, identically, the current $I_X$ of source 21 and, the collector current of transistor Q14, is identically, the current $I_G$ of source 31. Sources of relatively constant current (e.g. 21 and 31) are preferrable for use in conjunction with the differentially connected pair of transistors Q8, Q10 and Q12, Q13. But, each current source could be replaced by an impedance element of sufficient amplitude to cause a relatively constant current flow (e.g. like resistor R1 in combination with transistors Q1, Q2).

Transistors Q8 and Q10 are differentially connected, and only one of them is turned on at any one time (except during the transition period from one state to the other state). In the discussion to follow, the flow of base currents is neglected. When E is more positive than $\overline{E}$ the current $I_X$ flows through resistor R11 and the collector-to-emitter path of transistor Q8 and when E is less positive than $\overline{E}$ the current $I_X$ flows through resistor R12 and the collector-to-emitter path of transistor Q10. The amplitude of the current $I_X$ and the ohmic values of resistors R11 and R12 are selected so that a voltage drop of 0.4 volt is produced across resistor R11 and R12 when transistor Q8 or Q10 is conducting.

The potentials at the collectors, bases, and emitters of the transistors will be defined as $V_C$, $V_B$ and $V_E$, respectively, with the reference numeral of the corresponding transistor appended thereto, except, that the potential at the emitters of transistors Q8 nd Q10 will be identified as $V_X$.

The potentials on lines 5 and 7 will be referred to as R and S, respectively. When signals R and S are at −0.8 volt they are arbitrarily defined as being (logically) high or Hi and when signals R and S are at −1.6 volts they are arbitrarily defined as being (logically) low or Lo.

When the output signals E an $\bar{E}$ are at −2.4 volts they are arbitrarily defined as being logically) high or Hi. When the output signals E or $\bar{E}$ are either at −2.8 volts or at −3.6 volts they are arbitrarily defined as being (logically) low or Lo.

When the output signal E is more positive in potential than $\bar{E}$ the flip-flop is arbitrarily defined as being set and when $\bar{E}$ is more positive in potential than E the flip-flop is arbitrarily defined as being reset.

Transistor Q7 and diode D4 form a level shift network to couple the collector potential ($V_{CQ8}$) of transistor Q8 to the base of transistor Q10 less one $V_{BE}$ drop and one $V_F$ drop. Similarly, transistor Q9 and diode D5 form a level shift network to couple the collector potential of transistor Q10 to the base of transistor Q8 less one $V_{BE}$ drop and one $V_F$ drop. As stated above, each $V_{BE}$ drop and each $V_F$ drop is assumed equal to 0.8 volt. Thus, $V_{BQ10}$ is equal to $V_{CQ8}$ minus 1.6 volts and $V_{BQ8}$ is equal to $V_{CQ10}$ minus 1.6 volts.

The operation of the flip-flop will now be explained assuming that S and R follow the sequence outlined in I through V below.

I. Assume, initially, that R=S=−0.8 volt (Hi) ; that transistor Q10 is conducting (on), and that transistor Q8 is nonconducting (off). Since transistor Q10 is conducting there is a 0.4 volt drop across resistor R12. Consequently, the collector potential ($V_{CQ10}$) of transistor Q10 and the base potential ($V_{BQ9}$) of transistor Q9 are at −1.2 volts. The emitter potential ($V_{EQ9}$) of emitter follower transistor Q9 is −2.0 volts and the base potential ($V_{BQ8}$) of transistor Q8 is −2.8 volts. Since transistor Q8 is nonconducting its collector potential ($V_{CQ8}$) and the base potential ($V_{BQ7}$) of transistor Q7 are at −0.8 volt. The emitter potential ($V_{EQ7}$) of transistor Q7 is then −1.6 volts and the base potential ($V_{BQ10}$) of transistor Q10 is then −2.4 volts. The emitter potential ($V_X$) of differentially connected transistors Q8 and Q10 is then equal to −3.2 volts.

II. Assume, now, that S makes a transition from −0.8 volt (Hi) to −1.6 volts (Lo) and that R remains at −0.8 volt (Hi). Assume also that, initially, Q10 is on and Q8 is off. $V_{BQ7}$ decreases from −0.8 volt to −1.6 volts, $V_{EQ7}$ decreases from −1.6 volts to −2.4 volts, and $V_{BQ10}$ decreases from −2.4 volts to −3.2 volts. Consequently, $V_{BQ10}$ goes below $V_{BQ8}$ which is at −2.8 volts. Since $V_{BQ8}$ is at −2.8 volts, it holds or clamps the potential at the emitters of transistors Q8 and Q10 to −3.6 volts. Therefore, transistor Q10 turns off and transistor Q8 turns on. As transistor Q8 turns on, there is an additional 0.4 volt drop across resistor R11 causing each one of $V_{BQ7}$, $V_{EQ7}$ and $V_{BQ10}$ to decrease by another 0.4 volt. Concurrently, as transistor Q10 is turned off, there is no longer a voltage drop across resistor R12, and $V_{BQ9}$ and $V_{BQ8}$ are shifted upward by 0.4 volt. As $V_{BQ8}$ rises by 0.4 volt to −2.4 volts the emitter potential of transistor Q10 is also raised. Thus, transistor Q10 is being turned off by two mechanisms. One mechanism, is the lowing of its base potential (to −3.6 volts) due to the cross-coupled connection. The other mechanism is the simultaneous raising of its emitter potential (to −3.2 volts) due to the emitter coupled connection. The emitter-coupled and cross-coupled connections enable very fast turn off of Q10 since they result in the development of a reverse bias between the base and emitter of transistor Q10.

III. Assume now that S returns from −1.6 volts to −0.8 volt (R remained at −0.8 volt). The potentials at the base and emitter of transistor Q7 and at the base of transistor Q10 are raised by 0.8 volt. Due to the continued 0.4 volt drop across resistor R11, $V_{BQ10}$ is still 0.4 volt below $V_{BQ8}$. Accordingly transistor Q8 remains on and transistor Q10 remains off. Thus, resistor R11 performs the important function of providing 0.4 volt drop which is coupled to the base of the nonconducting transistor Q10. This voltage drop enables the retention of the state to which the flip-flop was switched when S went low to −1.6 volts.

Note that when S went to −1.6 volts (in paragraph II, above) $\bar{E}$ was driven to −3.6 volts and that when S returned to −0.8 volt E shifted up −2.8 volts. Both of these voltage conditions are designated as Lo logic conditions.

IV. Assume now that S remains at −0.8 volts and that R makes a transition from −0.8 volts to −1.6 volts. $V_{BQ9}$, $V_{EQ9}$ and $V_{BQ8}$ decrease by −0.8 volt. $V_{BQ8}$ is driven to −2.8 volt, which is less positive than $V_{BQ10}$ of −2.4 volts. Transistor Q10 now holds or clamps $V_X$ to −3.2 volts. Transistor Q10 then truns on and transistor Q8 turns off. As Q10 turns on, current flows through its collector emitter path causing a drop of 0.4 volt across resistor R12. Concurrently, as Q8 turns off, the voltage drop across resistor R11 is elimnated. As a result, $V_{BQ8}$ is driven still more negatively to −3.6 volts while $V_{BQ10}$ and $V_X$ are further raised to −2.4 volts and −3.2 volts, respectively. As stated above, the cross-coupling and the emitter-coupling of transistors Q8 and Q10 aid to quickly switch the flip-flop from one state to the other and in combination with the −0.8 volt transition of R provide a reverse bias condition for that one of transistors Q8 and Q10 which is being cut off.

V. Assume, now, that R returns from −1.6 volts to −0.8 volts (S remained at −0.8 volts). $V_{BQ7}$, $V_{EQ7}$ and $V_{BQ10}$ are each raised by 0.8 volt. Due to the 0.4 volt drop across resistor R12, $V_{BQ8}$ is still 0.4 volt below $V_{BQ10}$. Transistor Q10 thus remains on and transistor Q8 remains off. Resistor R12 performs a similar function to that described for resistor R11, above. It ensures the retention of the state to which the flip-flop was switched when the signal (R) on line 5 went low.

Following the return of R to −0.8 volt with S remaining at −0.8 volt the flip-flop assumes the levels set forth in paragraph I, above.

The conditions of E and $\bar{E}$ for the sequencing of S and R discussed above may be summarized as follows:

|  | S | R | E | $\bar{E}$ |
|---|---|---|---|---|
| I. | Hi<br>(−0.8) | Hi<br>(−0.8) | Lo<br>(−2.8) | Hi<br>(−2.4) |
| II. | ↓<br>Lo<br>(−1.6) | Hi<br>(−0.8) | Hi<br>(−2.4) | Lo<br>(−3.6) |
| III. | Hi | Hi<br>↓ | Hi<br>(−2.4) | Lo<br>(−2.8) |
| IV. | Hi | Lo<br>(−3.6) | Lo | Hi<br>(−2.4) |
| V. | Hi | Hi | Lo | Hi |

| -continued | | | |
|---|---|---|---|
| S | R | E | $\overline{E}$ |
| | | (−2.8) | (−2.4) |

As is evident from the above discussion, flip-flop 20 changes state when S or R makes a transition from Hi to Lo. When S or R switches back from Lo to Hi, the state of the flip-flop is not altered.

To more clearly appreciate certain features of the flip-flop it is advisable at this point to examine the minimum conditions necessary for switching the state of the flip-flop and the minimum conditions necessary to obtain reverse biasing of the transistor being turned off.

The voltage drop, $\Delta V$, produced across resistor R11 or R12 is necessary to generate a potential differential between the bases of the ON and OFF transistors for maintaining the flip-flop in its set or reset state. The minimum value of $\Delta V$ must be sufficiently large to overcome the differences if any, between the threshold voltages of the differentially connected transistors and the level shift networks and/or to ensure that noise or circuit differences do not prevent proper operation of the circuit. Due to the differential connection of transistors Q8 and Q10 their threshold voltages tend to cancel (one subtracts from the other). Therefore, only the difference of the two threshold voltages is a factor in the operation of the circuit. Present processes enable the manufacture of transistors on the same integrated circuit whose threshold voltages are within 15 or 20 millivolts or less of each other. Thus, although the circuit is subject to differences in the threshold voltages of the two differentially connected transistors, for all practical purposes the differences are sufficiently small to be neglected. In the present circuit $\Delta V$ has set at 0.4 volt. But $\Delta V$ could be, theoretically, very small (e.g. much less than 100 millivolts). The amplitude of the minimum potential differential (defined as $V_D$) that must be applied between lines 5 and 7 to switch the flip-flop from one condition to anothr has to be just slightly greater than $\Delta V$. Since $\Delta V$ can be very small, $V_D$ likewise can be very small. With respect to switching the flip-flop, it makes no difference whether one line (5 or 7) is moved up and down by $V_D$ volts and the other line is held at a fixed potential or whether the potentials on both lines are changed to produce a difference between the two lines of $V_D$ volts.

The operation described above is made possible because the current source connected to the emitters of transistors Q8 and Q10 looks like an extremely high impedance. As a result, $V_X$ can change without affecting the current in the circuit.

Note that if, as taught in the prior art, the emitters of transistors Q8 and Q10 were connected to points of fixed potential (e.g. $V_{EE}$ volts), the signals on lines 5 and 7 necessary to switch the flip-flop would have to be almost equal to $V_{EE}$ volts. For the example above, if Q10 were on and it were desired to switch the flip-flop, the potential on line 7 would have to be decreased by more than $V_{EE}-V_{BE}$ volts, that is, until the potential between the base and emitter of transistor Q10 were less than the $V_{BE}$ of transistor Q10. Until that point were reached, the collector-to-emitter path of transistor Q10 would be clamping the base potential of the OFF transistor to ground potential.

The flip-flop changes state faster if the transistor being turned off is driven into a reverse biased condition. The conditions necessary for reverse bias may be explained as follows.

the potential ($V_X$) at the emitter of the differentially connected transistors is held at $V_H-V_{LS}-V_{BE}$ by the transistor being turned on; where $V_H$ is equal to the high value of the potential on lines 5 and 7 and $V_{LS}$ is the constant voltage drop ($V_B$ plus $V_F$) across the level shift network (Q7, D4 or Q9, D5). In order to reverse bias the transistor being cut off, its base potential must be more negative than its emitter potential ($V_X$). Accordingly, the potential at the base of the transistor being cut off must be less positive than $V_H-V_{LS}-V_{BE}$.

When the switching potential ($V_S$) on one of the lines goes negative with respect to the other, the potential at the base of the transistor being cut off may be expressed as $V_H-V_{LS}-\Delta V-V_S$. therefore, $\Delta V + V_S$ must be slightly greater than $V_{BE}$ in order to cause the transistor being turned off to be reverse biased. For $V_{BE}$ equal to 0.8 volt and for $\Delta V$ set at −0.4 volt, signals on line 5 or 7 greater than −0.4 volt, result in the reverse biasing of the transistor being turned off.

Note that if the emitters of transistors Q8 and Q10 were connected to a point of fixed potential, as in the prior art, then the potential necessary to reverse bias the transistor being turned off would have to exceed $V_{EE}$ plus the threshold voltage of the transistor being turned off.

It should be clear from the above that in circuits embodying the invention the flip-flop may be switched from one state to another with extremely small amplitude signals and that the effect of the threshold voltage of the devices is greatly reduced.

When flip-flop 20 is set, E is either 1.2 volts or 0.4 volt more positive than $\overline{E}$. Conversely, when flip-flop 20 is reset, $\overline{E}$ is eithr 1.2 volts or 0.4 volt more positive than E. This ensures ample noise margin between the two closest signal conditions.

The level shifting provided by transistors Q7 and Q9 and diodes D4 and D5 prevents transistors Q8 and Q10 from going into saturation. When transistors Q8 and Q10 are conducting their lowest collector potential is −2.0 volts and their base potential is −2.4 volts. The highest base potential is obtained by level shifting down the collector potential of the off transistor to the base of the on transistor through the $V_{BE}$ drop of emitter follower transistor Q7 or Q9 plus the $V_F$ of diode D4 or D5. This effectuates a downward level shift of 1.6 volts. The collector potential of transistor Q8 or Q10 when turned off is, at most, equal to −0.8 volt causing the base of transistor Q8 or Q10 when turned on to be, at most, equal to −2.4 volts.

The setting and resetting of flip-flop 20 by means of ECL gate 10 is illustrated in the waveforms of FIG. 2. As shown for times $t_0$ and $t_4$, when a data input signal (A) and a sampling pulse (B) of −0.8 volt amplitude are present, the sampled signal (S) on line 7 makes a negative going excursion from −0.8 volt to −1.6 volts which changes E to −2.4 volts and $\overline{E}$ to −3.6 volts. Upon the termination of the sampled signals at times $t_A$ and $t_B$, E remains at −2.4 volts. Each time the signal (R) on line 5 makes a negative going excursion −0.8 volt to −1.6 volts (e.g. times $t_1$, $t_3$, $t_5$), E is changed to −3.6 volts and $\overline{E}$ goes to −2.4 volts. When R returns to −0.8 volt E returns to −2.8 volts as shown at time $t_2$.

In the circuit of FIG. 1, E is high (−2.4 volts) only for a period T1 beginning with a negative going excursion of S and terminating with the negative going excursion of R. The voltage level at E is normally low (−2.8 or −3.6 volts) with respect to $\overline{E}$ except for a period T1 folowing the concurrent presence of a data input signal and a sampling pulse. Flip-flop 20 in combination with ECL gate 10, thus, produces pulses of controlled width.

As may be observed from the waveforms of FIG. 2, the output data pattern is not immediately aparent due, in part, to the voltage level variations in E and $\overline{E}$ and, in part, to the clocking pulses. The use of differential gate 30 to sense the state of the flip-flop eliminates possible ambiguities due to the voltage variations in the low levels of the E and $\overline{E}$ outputs.

The E and $\overline{E}$ outputs are applied to the base of transistor Q13 and Q12, respectively. The current source current $I_G$ flows through the collector-to-emitter path of transistor Q12 and resistor R15 if $\overline{E}$ is more positive than E and flows through the collector-to-emitter path of transistor Q13 and resistor R16 when E is more positive than $\overline{E}$. $I_G$ is set by the selection of the value of potential applied to terminal 19 and the values of resistors R17, R18 and R19. Assume the $I_G$ is 1 milliampere and that resistors R15 and R16 are 800 ohms. In which case, a 0.8 volt drop is produced across that one of resistor R15 and R16 through which $I_G$ flows. In response to E high and $\overline{E}$ low, a positive going signal (−0.8 volt to zero volts) is produced at F and a negative going signal (0 to −0.8 volt) is produced at $\overline{F}$. The F and $\overline{F}$ outputs pulses produced in response to the presence of each sampled pulse are shown in FIG. 2. Each pulse has a unique voltage level for a given logic condition being either approximately, zero volts or approximately, −0.8 volt. These levels were selected because of their compatibility with conventional ECL gates.

Although signals of 0.8 volt amplitude are used to switch the state of the flip-flop, small changes applied to line S or R, or between the two, can cause the flip-flop to switch which increases the speed of response of the flip-flop.

Emitter follower transistors Q4, Q5 and Q6 serve to supply both the operating potential and the set and reset signals to the flip-flop. Transistors Q5 and Q6 supply the potential to one side or branch of the flip-flop and transistor Q4 supplies the potential to the other side or branch of the flip-flop. When signals are applied to the bases of transistor Q4, Q5 and Q6, they translate those signals into potential changes at their emitters. These potential changes alter the value of the potential applied to that branch of the flip-flop to which the emitter is connected. Thus, the set and reset signals applied to lines 5 and 7 are in fact alterations or changes in the positive potential levels on those lines.

In the circuit of FIG. 1 the outputs of the flip-flop have been taken at the bases of transistors Q8 and Q10. But, these outputs are derived from the signals produced at the collectors of transistors Q8 and Q10 and could have been taken there or at the emitters of transistors Q7 and Q9.

Figure 3:
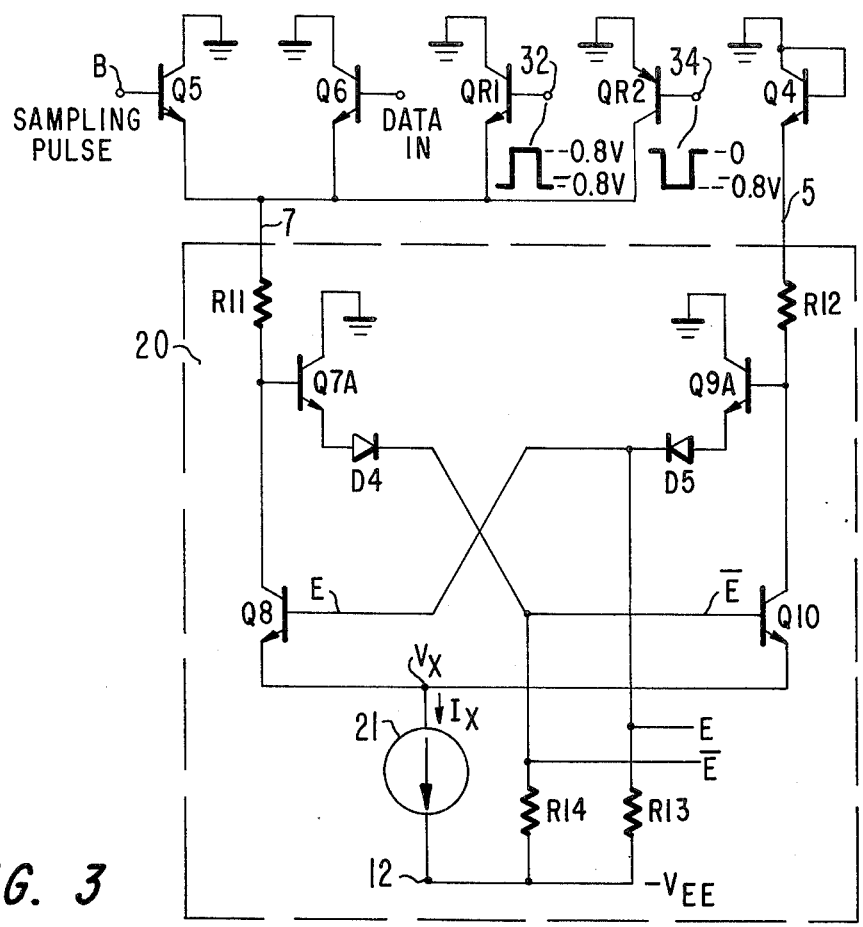
FIG. 3 is a schematic diagram of another flip-flop circuit embodying the invention.

In the circuit of FIG. 1 cross-coupling emitter follower transistors Q7 and Q9 are connected at their collector to lines 7 and 5, respectively. Transistors Q7 and Q9, therefore, draw their collector currents from lines 5 and 7 and thereby function to quickly discharge these lines to the low level conditions. In many instances, this is a distinct advantage since it permits very quick response of the flip-flop. Alternatively, as shown in the circuit of FIG. 3, cross-coupling emitter follower transistors Q7A, and Q9A, may be connected at their collectors to ground potential. This arrangement decreases the loading on lines 5 and 7 and may be necessary when the setting and resetting emitter followers (Q5, Q6, and Q4) cannot supply large currents.

In the circuit of FIG. 1, the flip-flop was switched to its two stable states by applying negative signals to lines 5 and 7. Alternatively, the flip-flop may be set and reset by applying negative and positive signals to only one of the two lines (5 or 7) and maintaining the other one of the two lines (5 or 7) at a fixed level. In FIG. 3, by way of example, line 5 is held at a fixed potential (−0.8 volt) by connecting the base of transistor Q4 to ground. The flip-flop may be set by means of transistors Q5 and Q6 connected and operated as shown and discussed for FIG. 1. The flip-flop may be reset by means for applying signals of zero volts to line 7. These means include NPN transistor QR1 having its collector connected to ground, its emitter connected to line 7 and its base returned to a terminal 32 to which is applied reset signals varying between −0.8 volt and −0.8 volt. The flip-flop could also be reset by means of PNP transistor QR2 connected at its emitter to ground, at its collector to line 7 and at its base to a terminal 34 to which is applied negative going signals which can cause transistor Q2 to saturate and clamp line 7 to ground.

As described for the circuit of FIG. 1, when the signals A & B applied to the bases of transistors Q5 and Q6 go to −0.8 volt they cause the signal S on line 7 to go to −1.6 volts. Transistor Q10 is then turned off and transistor Q8 is turned on. The flip-flop is set to the condition of E-Hi and $\overline{E}$-Lo. When signals A and B return to zero volts, the flip flop remains set to E-Hi, ($\overline{E}$-Lo).

The flip-flop may be reset by applying a potential of zero volts to line 7. This may be accomplished by applying a signal of +0.8 volt to the base of transistor QR1 or by applying a negative going signal to the base of PNP transistor QR2 causing it to saturate and clamp line 7 to zero volts.

When the potential on line 7 ($V_7$), goes from −0.8 volt to zero volts, $V_{BQ7}$ goes from −1.2 volts to −0.4 volt, $V_{EQ7}$ goes to −12. volt and $V_{BQ10}$ ($\overline{E}$) goes from −2.8 volts to −2.0 volts. This causes $V_X$ to rise from −3.2 volts to −2.8 volts. Since $V_{BQ8}$ (E) was at −2.4 volts transistor Q8 turns off while transistor Q10 is turned on. As transistor Q8 turns off, $V_{BQ7A}$ goes to zero volts, $V_{EQ7A}$ goes to −0.8 volt, and $V_{BQ10}$ ($\overline{E}$) goes to −1.6 volt. When transistor Q10 conducts, a 0.4 volt drop is produced across resistor R12. $V_{BQ9}$ goes to −1.2 volt, $V_{EQ9}$ goes to −2.0 volts and $V_{BQ8}$ (E) goes to −2.8 volts. Clearly, transistor Q10 is thus further driven into conduction and transistor Q8 is reverse biased and driven further into cut off.

When the reset pulse terminates the potential, $V_7$ returns from zero volts to −0.8 volt, at which point the potential $V_{BQ7}$ goes to −0.8 volt, $V_{EQ7}$ goes to −1.6 volt and $V_{BQ10}$ ($\overline{E}$) goes to −2.4 volts. Since $V_{BQ8}$ (E) is at −2.8 volts, transistor Q8 remains off and transistor Q10 remains conducting. For the circuit configuration of FIG. 3, when $\overline{E}$ is logically Lo it may be either −2.8 volts or −3.6 volt and when $\overline{E}$ is logically Hi it may be either −1.6 volts or −2.4 volts. E on the other hand is equal to −2.4 volts when Hi and −2.8 volts when Lo. E and $\overline{E}$ may be applied to a differential gate such as gate 30 to produce output signals having unique levels.

It has thus been shown, in FIG. 3, that one (line 5) of the two input lines to the flip-flop may be held at a fixed potential (−0.8 volt) and that the potential at the other line (line 7) may be raised below or above that fixed potential in order to set and reset the flip-flop.

As for the circuits of FIGS. 1 and 3, the amplitude of the negative going set or reset signals ($V_S$) applied to lines 5 or 7 must exceed $\Delta V$ volts to cause the flip-flop to switch. And, as before, $V_S$ and $\Delta V$ must exceed the threshold voltage, $V_T$, of the transistors to cause reverse bias of the transistor being cut off.

IGFETs have substantially zero gate-source currents and therefore the assumptions made earlier with respect to neglecting base currents, hold even more exactly for IGFETs. Also, the threshold voltages of IGFETs may be larger and vary more than those of bipolar transistors. Therefore, it is extremely advantageous in circuits using IGFETs to make use of the teaching of the instant invention.

Figure 4:
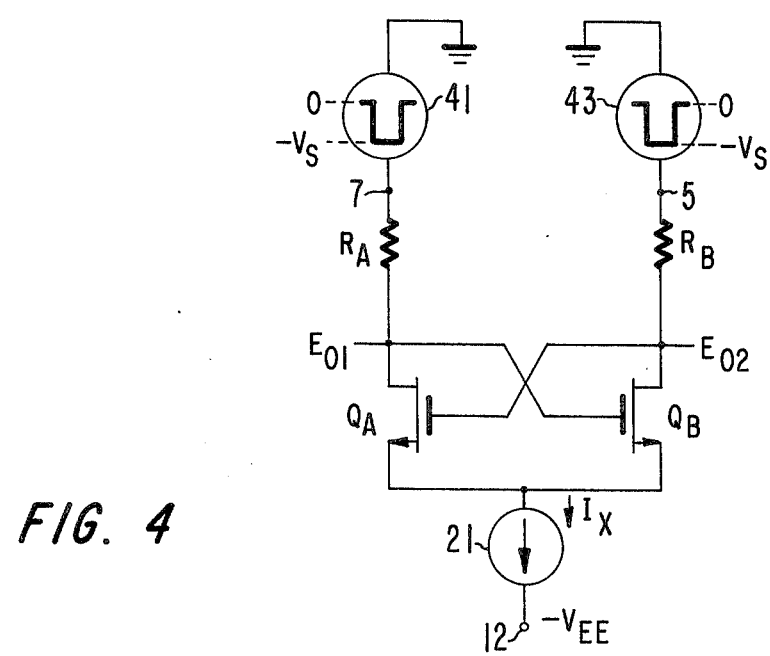
FIG. 4 is a schematic diagram of still another flip-flop circuit embodying the invention.

In the circuit of FIG. 4, two insulated-gate field-effect transistors QA and QB, are cross-coupled to form a flip-flop. In addition, the source electrodes of the two transistors are connected to one end of current source 21 whose other end is connected to terminal 12 to which is applied $-V_{EE}$ volts. A resistor $R_A$ is connected between the drain of transistors QA and line 7 and a resistor $R_B$ is connected between the drain of transistor QB and line 5. These resistors perform a similar function to that of resistors R11 and R12 in FIGS. 1 and 3. Outputs $E_{01}$ and $E_{02}$ are taken at the drains of transistors QA and QB, respectively. Sources 41 and 43 connected between ground and lines 7 and 5, respectively, function both to provide power to the flip-flop and to set and reset the flip-flop. Sources 41 and 43 perform an analogous function to that performed by transistors Q4, Q5 and Q6 of FIGS. 1 and 3 with their associated base drives. The circuit of FIG. 4 is similar to the flip-flop circuit of FIGS. 1 and 3 except that the level shift networks (Q7, Q4, Q9 and D5) have been eliminated.

The operation of the circuit is similar to that of the flip-flops described above. The $\Delta V$ drop across RA or RB is equal to the product of the current $I_X$ and the ohmic value of the resistor (RA or RB) through which $I_X$ flows. Signal sources 41 and 43 maintain the potentials on lines 5 and 7 at the same, normally high, value of $V_H$.

As for the circuits of FIGS. 1 and 3, the amplitude of the negative going set or reset signals ($V_S$) applied to lines 5 or 7 must exceed $\Delta V$ volts to cause the flip-flop to switch. And, as before, $V_S$ and $\Delta V$ must exceed the threshold voltage, $V_T$, of the transistors to cause reverse bias of the transistor being cut off.

IGFETs have substantially zero gate-source currents and therefore the assumptions made earlier, with respect to neglecting base currents, hold even more exactly for IGFETs. Also, the threshold voltages of IGFETs may be larger and vary more than those of bipolar transistors. Therefore, it is extremely advantageous in circuits using IGFETs to make use of the teaching of the instant invention.

What is claimed is:

1. The combination comprising:
   first and second transistors, each transistor having first and second electrodes defining the ends of a main conduction path and a control electrode;
   means for producing a relatively constant current connected to the first electrodes of said first and second transistors;
   means direct current coupling the second electrode of said first transistor to the control electrode of said second transistor;
   means direct current coupling the second electrode of said second transistor to the control electrode of said first transistor;
   first and second lines;
   a first impedance means connected between the second electrode of said first transistor and said first line;
   a second impedance means connected between the second electrode of said second transistor and said second line, each of said first and second impedance means for producing a voltage drop thereacross proportional to the current flowing therethrough; and
   means connected to said first and second lines for selectively applying a difference in potential between said first and second lines, for causing one of said first and second transistors to conduct and the other one of said first and second transistors to be turned off when the potential on said first line is negative with respect to that on said second line; and for causing said other one of said first and second transistors to conduct and said one of said first and second transistors to be turned off when the potential on said first line is positive with respect to that on said second line.

2. The combination as claimed in claim 1 wherein said means connected to said first and second lines normally apply the same potential to said first and second lines.

3. The combination as claimed in claim 1 wherein said first and second transistors are insulated-gate field-effect transistors.

4. The combination as claimed in claim 1 wherein said transistors are bipolar transistors, each having a base, an emitter and a collector, wherein said base is said control electrode, said emitter is said first electrode and said collector is said second electrode; and
   wherein one of said first and second lines is a set line, and the other one of said first and second lines is a reset line.

5. The combination as claimed in claim 1 wherein the means coupling the second electrode of said first transistor to the control electrode of said transistor includes a first level shift means; and wherein the means coupling the second electrode of said second transistor to the control electrode of said first transistor includes a second level shift means.

6. The combination as claimed in claim 5, wherein said first and second transistors are bipolar transistors, each having a base, an emitter and a collector; wherein said base is said control electrode, said emitter is said first electrode and said collector is said second electrode; and wherein said first level shift means includes a first coupling bipolar transistor connected at its base to the collector of said first transistor and coupled at its emitter to the base of said second transistor; and
   wherein said second level shift means includes a second coupling bipolar transistor connected at its base to the collector of said second transistor and coupled at its emitter to the base of said first transistor.

7. The combination as claimed in claim 6 wherein the emitter of said first coupling transistor is coupled to the base of said second transistor through a first diode; wherein the emitter of said second coupling transistor is coupled to the base of said first transistor through a second diode;

wherein the collector of said first coupling transistor is connected to said first line; and wherein the collector of said second coupling transistor is connected to said second line.

8. The combination as claimed in claim 1, wherein the amplitude of the differential signal applied between said first and second transistors to turn off that one of said first and second transistors which is conducting and to turn on the other one of the two transistors, must exceed the voltage drop produced by the flow of said relatively constant current through that one of said first and second impedances connected to the transistor which is conducting.

9. The combination as claimed in claim 1, wherein the amplitude of the differential signal applied between said first and second lines necessary to reverse bias that one of said first and second transistors which is conducting and to turn on the other one of the two transistors must exceed the difference between the threshold voltage of the transistor being turned off and the amplitude of the voltage drop produced by the flow of said relatively constant current through that one of said first and second impedances which is connected to the second electrode of the transistor which is being turned on.

10. The combination as claimed in claim 1 wherein said means for producing a relatively constant current includes means connected between said first electrodes of said first and second transistors and a first power terminal;

wherein said means connected to said first and second lines includes: (a) at least one transistor having its main conduction path connected between said first line and a second power terminal; (b) at least one additional transistor having its main conduction path connected between said second line and said second terminal; and (c) means for applying a potential difference between the control electrodes of said at least one and at least one additional transistors for selectively causing the potential on one line to be more positive than or more negative than the potential on the other line; and wherein said first and second power terminals are adapted for the application therebetween of an operating potential.

11. The combination as claimed in claim 10 wherein said transistors connected between said second terminal and said first and second lines are set and reset transistors, respectively; and are of the same conductivity type as said first and second transistors and function as voltage followers.

12. The combination as claimed in claim 10 further including a further transistor having its main conduction path connected between one of said first and second lines and said second terminal; and further including a data input terminal connected to the control electrode of said further transistor.

13. The combination as claimed in claim 1 wherein said means for producing a relatively constant current includes means connected between said first electrodes of said first and second transistors and a first power terminal;

wherein said means connected to said first and second lines includes: (a) a third transistor having its main conduction path connected between said first line and a second power terminal; (b) a fourth transistor having its main conduction path connected between said second line and said second terminal; (c) means for applying a fixed potential to the control electrode of one of said third and fourth transistors; and (d) means for applying signals varying positively and negatively with respect to said fixed potential to the control electrode of the other one of said third and fourth transistors; and wherein said first and second power terminals are adapted for the application therebetween of an operating potential.

14. The combination as claimed in claim 1 further including a differential amplifier having first and second inputs and at least one output;

means coupling said first input to the control electrode of said first transistor; and means coupling said second input to the second electrode of said control transistor; said amplifier producing at said at least one output a signal having a first level when the signal applied to its first input is more positive than the signal applied to its second input and having a second different level when the signal applied to its first input is more negative than the signal applied to its second input.

15. The combination as claimed in claim 1, wherein said means connected to said first and second lines includes a differential stage having first and second inputs for the application therebetween of an input signal and having first and second outputs;

a first emitter follower connected between said first output and said first line; and a second emitter follower connected between said second output and said second line.

16. The combination as claimed in claim 15, wherein a pulse forming network is connected between said first and second outputs for producing non-complementary time coincident pulses at said first and second outputs.

17. The combination as claimed in claim 1 wherein said first and second impedances are first and second resistors, respectively.

* * * * *

UNITED STATES PATENT OFFICE
CERTIFICATE OF CORRECTION

PATENT NO. : 4,021,686
DATED : May 3, 1977
INVENTOR(S) : Borys Zuk

It is certified that error appears in the above-identified patent and that said Letters Patent are hereby corrected as shown below:

| | |
|---|---|
| Col. 1, line 46 | "couple" should be --- coupled--- |
| Col. 5, line 23 | after "should" insert --- also --- |
| Col. 8, line 26 | "truns" should be --- turns --- |
| Col. 9, line 37 | after "has" insert --- been --- |
| Col. 10, line 5 | "the" (first occurrence) should be --- The --- |
| Col. 10, line 37 | "eithr" should be --- either --- |
| Col. 10, line 42 | "and" should be --- or --- |
| Col. 10, line 63 | after "excursion" insert --- from --- |
| Col. 11, line 4 | "folowing" should be --- following --- |
| Col. 12, line 20 | "-0.8 volt" (second occurrence) should be --- +0.8 volt --- |
| Claim 5, line 3 | after "said" insert --- second --- |
| Claim 14, line 6 | "second" (second occurrence) should be --- control --- |
| Claim 14, line 7 | "control" should be --- second --- |

Signed and Sealed this

Sixth Day of September 1977

[SEAL]

Attest:

RUTH C. MASON
Attesting Officer

LUTRELLE F. PARKER
Acting Commissioner of Patents and Trademarks